United States Patent
Moore

(10) Patent No.: US 11,492,026 B1
(45) Date of Patent: Nov. 8, 2022

(54) SINGLE RAIL SHUNT CABLE ASSEMBLY

(71) Applicant: David Brian Moore, Vancouver, WA (US)

(72) Inventor: David Brian Moore, Vancouver, WA (US)

( * ) Notice: Subject to any disclaimer, the term of this patent is extended or adjusted under 35 U.S.C. 154(b) by 268 days.

(21) Appl. No.: 16/877,812

(22) Filed: May 19, 2020

Related U.S. Application Data

(60) Provisional application No. 62/851,251, filed on May 22, 2019.

(51) Int. Cl.
| | | |
|---|---|---|
| B61L 1/18 | (2006.01) | |
| G01R 27/02 | (2006.01) | |
| H02G 9/02 | (2006.01) | |
| H02G 11/02 | (2006.01) | |

(52) U.S. Cl.
CPC .............. B61L 1/181 (2013.01); G01R 27/02 (2013.01); H02G 9/02 (2013.01); H02G 11/02 (2013.01)

(58) Field of Classification Search
CPC ........... G01R 27/00; G01R 27/02; B61L 1/00; B61L 1/18; B61L 1/181; H02G 9/00; H02G 9/02; H02G 11/00; H02G 11/02

USPC ....................................................... 238/14.05
See application file for complete search history.

(56) References Cited

U.S. PATENT DOCUMENTS

| | | | |
|---|---|---|---|
| 8,939,380 B1* | 1/2015 | Bousquet ................. | B60M 5/00 238/14.2 |
| 2005/0231376 A1* | 10/2005 | Hatfield .................. | B61L 29/30 340/687 |

FOREIGN PATENT DOCUMENTS

BR    B R-102012021695 A2 * 11/2014

* cited by examiner

*Primary Examiner* — Hoai-An D. Nguyen
(74) *Attorney, Agent, or Firm* — Plager Schack LLP; Mark H. Plager; Michael J. O'Brien

(57) ABSTRACT

A single rail shunt cable assembly is configured to repair a damaged railroad rail segment. The single rail shunt cable assembly has a shunt cable with a first shunt cable end and a second shunt cable end. A first cable clip is joined to the first shunt cable end. A second cable clip is joined to the first shunt cable end. An ohm meter is joined to the shunt cable proximate the first cable clip. The ohm meter that shows a circuit connection between the first clamp and the second clamp when the first clamp and the second clamp are attached to the damaged railroad rail segment.

4 Claims, 3 Drawing Sheets

SINGLE RAIL SHUNT CABLE ASSEMBLY

RELATED APPLICATION

This application claims priority to provisional patent application U.S. Ser. No. 62/851,251 filed on May 22, 2019, the entire contents of which is herein incorporated by reference.

BACKGROUND

The embodiments herein relate generally to a shunt, and more particularly a railroad single rail shunt cable device. In the rail industry, a shunt cable is used to help repair a broken railroad track. Railroads have an electrical current that runs through the railroad track that is monitored by a railroad Dispatcher's Office. When the track and the electrical circuit created by the electrical current is intact, the Dispatcher's Office sees the tracks as available through various monitoring equipment. If the track brakes or becomes damaged where the electrical circuit is interrupted, the Dispatcher's Office sees all the track as unavailable down the track line from the brake. When this occurs repair crews will set out to repair the damaged track. During this repair process, the repair crew will also place the shunt cable around the damaged area of the track, completing the electrical current running through the track so that the Dispatcher's Office can now see which track is available down the line to accept train traffic.

A shunt cable typically consists of clamps and low resistance wire. This low-resistance wire apparatus, when clamped to the track, completes an electrical current that was previously affected by the track damage. Workers repairing railroad tracks, calibrating equipment, or performing general maintenance on the tracks, make use of these shunts to ensure that the workers are safe. Prior to attaching a shunt cable to the rails, the Dispatcher's Office receives notification of a broken rail and the need to divert trains from entering the area requiring repair. Workers tell the Dispatcher's Office that section of the track is being repaired and the Dispatcher's Office diverts trains from entering the area. Workers then add the shunt cable to reconnect the electrical current running through the track, while repairing it, so that the Dispatcher's Office can make use of track down the line. This reduces the danger to equipment, personnel and preventing interference operations as well as allowing the Dispatcher's Office to use successive track systems. Without an adequate shunt, these precautions fall short and the people and equipment in that location in question could be in danger.

Current shunt devices, however, do not meet all of the needs of the workers who are repairing the tracks. These devices have a tendency to wear at the clamps and can dislodge from the tracks giving the Dispatcher's Office false alerts. This requires extra personnel to watch the shunting cables to make sure that the cables do not detach from the rails while under repair as well as make sure that there is a complete circuit connection resulting in a need for more repair personnel. If the current shunt devices fail either from having a poor connection required to complete the circuit or fall off the rails, the Dispatcher's Office is misinformed as to the availability of the rail line, which requires extra personnel from the Dispatcher's Office to check the availability of the lines further on down the track. This may result in fines against the workers repairing the rails for creating false indications of track availability and possibly have the workers pulled from service for creating false indications of track availability. Shunt cable failure can also pose a potential danger to the public at railroad crossings.

Therefore, what is needed is single rail shunt cable device that attaches to one damaged rail with an indicator of electrical current connection and retractable wires allowing for varying wire length that aids in securing the shunt cable to the track that still allows for trains to pass along the train tracks further down the track line while the device is connected to the rail.

SUMMARY

A single rail shunt cable assembly is configured to repair a damaged railroad rail segment. The single rail shunt cable assembly has a shunt cable with a first shunt cable end and a second shunt cable end. A first cable clip is joined to the first shunt cable end. A second cable clip is joined to the first shunt cable end. An ohm meter is joined to the shunt cable proximate the first cable clip. The ohm meter that shows a circuit connection between the first clamp and the second clamp when the first clamp and the second clamp are attached to the damaged railroad rail segment.

In some embodiments, a railroad track having a plurality of ties joined to a first rail and a second rail. The first rail further comprises a first rail first segment, a first rail second segment, and a first rail third segment; wherein the first rail second segment is the damaged railroad rail segment.

BRIEF DESCRIPTION OF THE FIGURES

The detailed description of some embodiments of the invention is made below with reference to the accompanying figures, wherein like numerals represent corresponding parts of the figures.

DETAILED DESCRIPTION OF CERTAIN EMBODIMENTS

Figure 1:
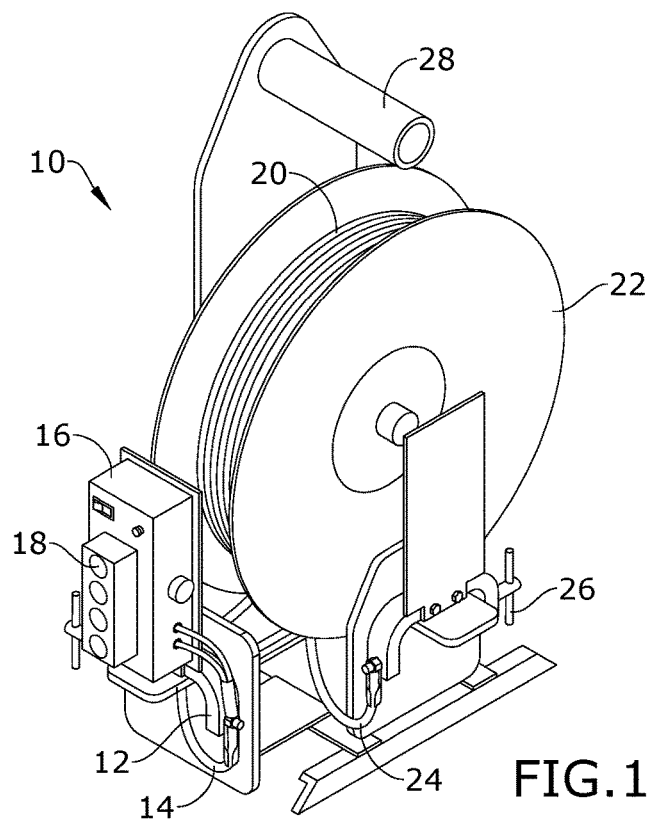
FIG. 1 shows a perspective view of one embodiment of the present invention.

By way of example, and referring to FIG. 1, one embodiment of a single rail shunt cable assembly 10 further comprises a first shunt cable clamp 12 joined to a first shunt cable end 14. The first shunt cable end 14 is further connected to an inline ohm meter 16. The inline ohm meter 16 is joined to signal lights 18.

The first shunt cable end 14 is part of a shunt cable 20 that is wrapped around a spool 22. The shunt cable 20 further comprises a second shunt cable end 24. The second shunt cable end 24 is joined to a second shunt clamp 26. In some embodiments, the spool 22 further comprises a handle 28.

Figure 2:
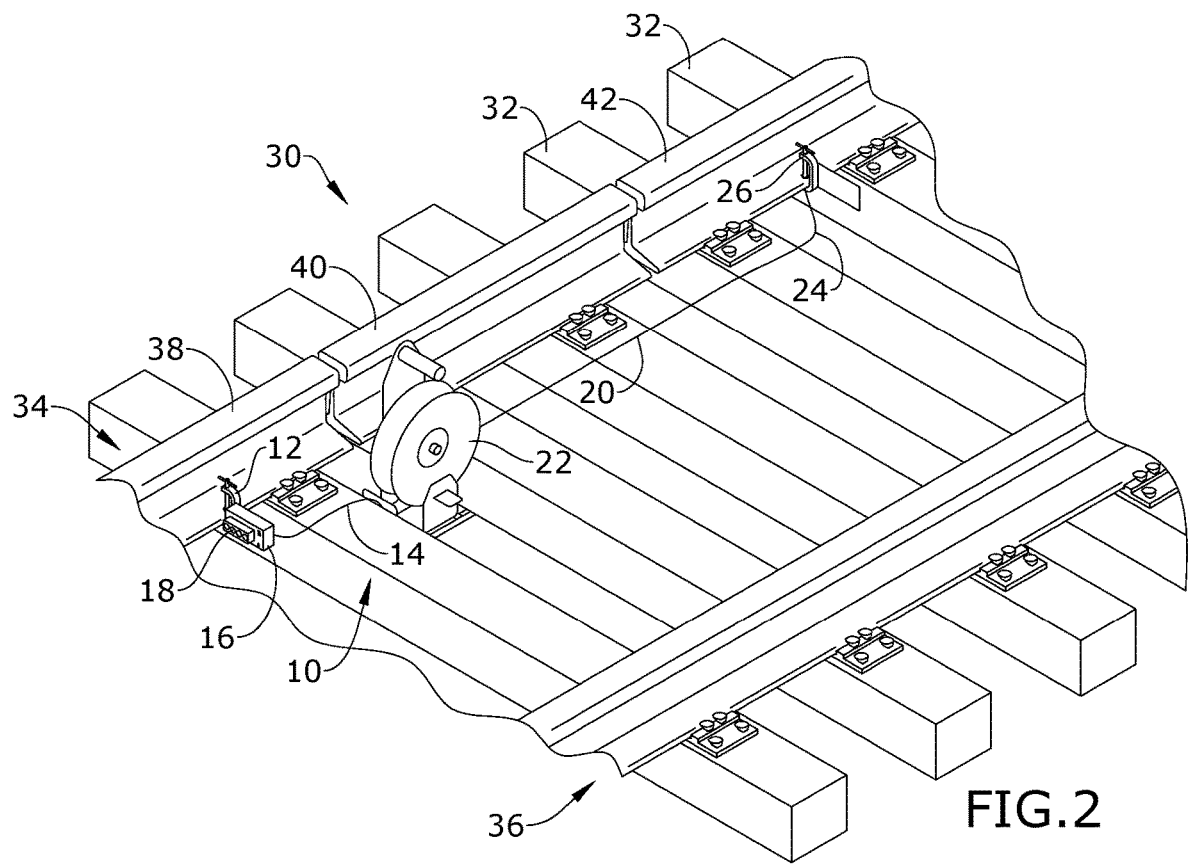
FIG. 2 shows a perspective view in use of one embodiment of the present invention.

Turning to FIG. 2, a railroad track 30 is shown having a plurality of ties 32 joined to a first rail 34 and a second rail 36. The first rail 34 is segmented into a first rail first segment 38, a first rail second segment 40, and a first rail third segment 42. The first rail first segment 38 and the first rail third segment 42 are carrying current while the first rail second segment 40 is not carrying current and is under repair.

Figure 3:
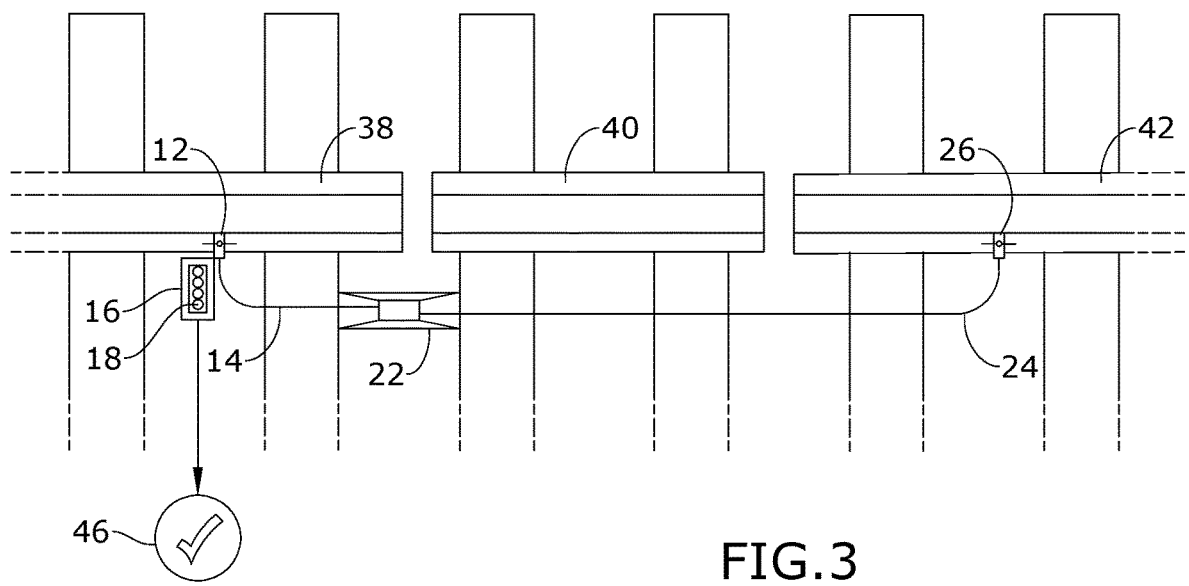
FIG. 3 shows a schematic view in use of one embodiment of the present invention showing a circuit complete and stable.

In FIG. 3, the first shunt cable clamp 12 is joined to the first rail first segment 38 while the second shunt cable clamp 26 is joined to the first rail third segment 42. The current is complete and stable and the signal lights 18 show a completed current signal 46.

Figure 4:
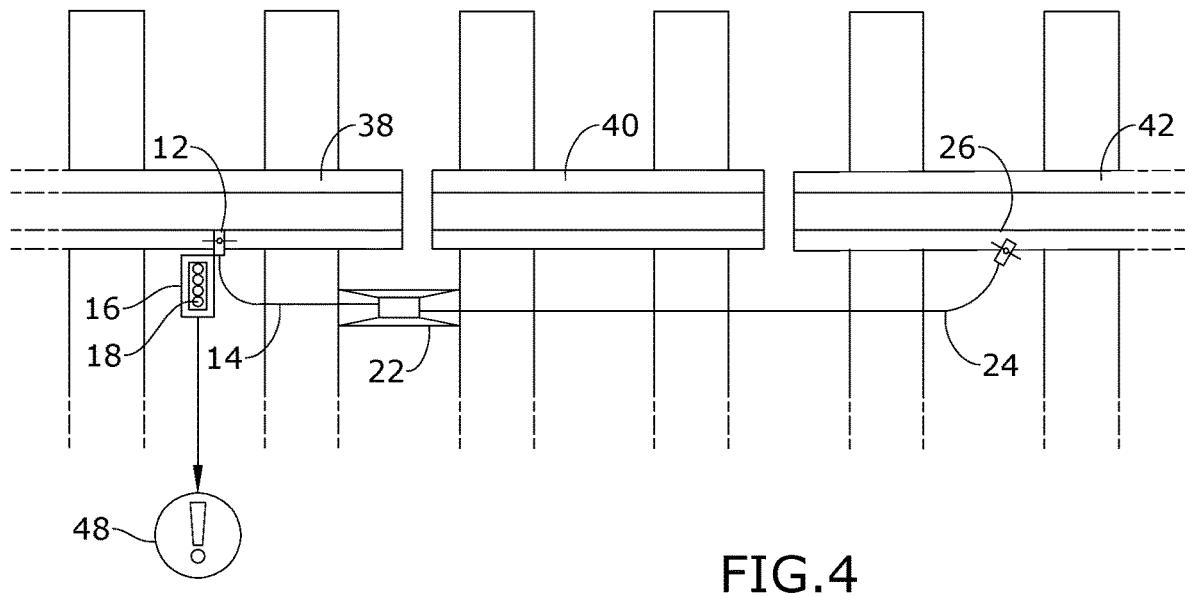
FIG. 4 shows a schematic view in use of one embodiment of the present invention showing a clamp having slipped interrupting or weakening the circuit.

In FIG. 4, the first shunt cable clamp 12 is joined to the first rail first segment 38 while the second shunt cable clamp 26 from the first rail third segment 42. The current is interrupted or weak and the signal lights 18 show a warning signal 48.

Figure 5:
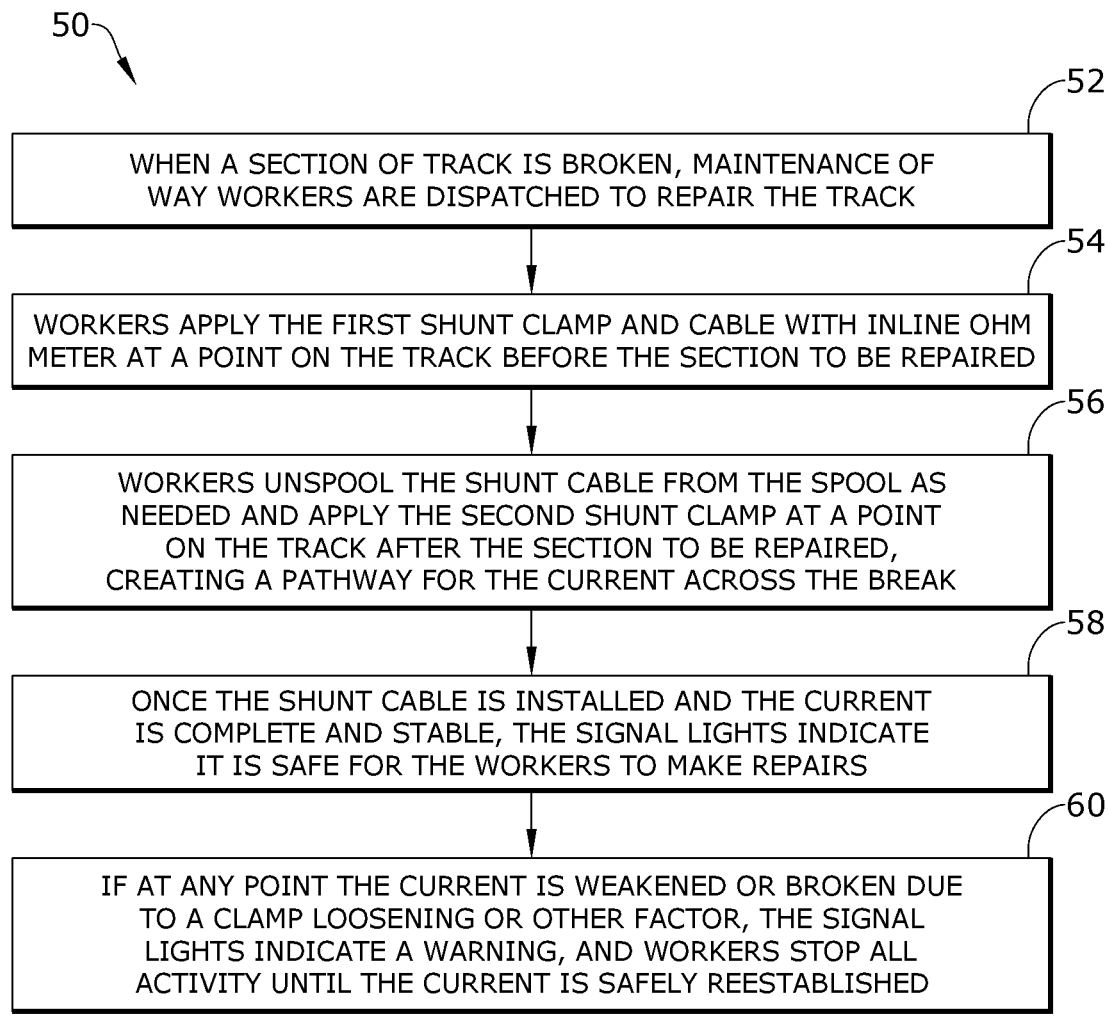
FIG. 5 shows a flow chart of one embodiment of the present invention.

FIG. 5 shows a process 50 for using a single rail shunt cable assembly 10. In step 52, a section of track is broken and maintenance of way workers are dispatched to repair the track. At step 54, workers apply the first shunt cable clamp 12 and shunt cable 20 with the inline ohm meter 16 at a point on the track before the section to be repaired. At step 56, workers unspool the shunt cable 20 from the spool 22 as needed and apply the second shunt clamp 26 at a point on the track after the section to be repaired. This creates a pathway for the current around the first rail second segment 40. At step 58, once the shunt cable 20 is installed and the current is complete and stable, the signal lights 18 indicate it is safe for the workers to make repairs. At step 60, if at any point the current is weakened or broken due to a clamp loosening or other factor, then the signal lights 18 indicate a warning, and workers stop all activity until the current is safely reestablished.

As used in this application, the term "a" or "an" means "at least one" or "one or more."

As used in this application, the term "about" or "approximately" refers to a range of values within plus or minus 10% of the specified number.

As used in this application, the term "substantially" means that the actual value is within about 10% of the actual desired value, particularly within about 5% of the actual desired value and especially within about 1% of the actual desired value of any variable, element or limit set forth herein.

All references throughout this application, for example patent documents including issued or granted patents or equivalents, patent application publications, and non-patent literature documents or other source material, are hereby incorporated by reference herein in their entireties, as though individually incorporated by reference, to the extent each reference is at least partially not inconsistent with the disclosure in the present application (for example, a reference that is partially inconsistent is incorporated by reference except for the partially inconsistent portion of the reference).

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

Any element in a claim that does not explicitly state "means for" performing a specified function, or "step for" performing a specified function, is not to be interpreted as a "means" or "step" clause as specified in 35 U.S.C. § 112, ¶6. In particular, any use of "step of" in the claims is not intended to invoke the provision of 35 U.S.C. § 112, ¶6.

Persons of ordinary skill in the art may appreciate that numerous design configurations may be possible to enjoy the functional benefits of the inventive systems. Thus, given the wide variety of configurations and arrangements of embodiments of the present invention the scope of the invention is reflected by the breadth of the claims below rather than narrowed by the embodiments described above.

What is claimed is:

1. A single rail shunt cable assembly configured to repair a damaged railroad rail segment, the assembly comprises:
    a shunt cable further comprising a first shunt cable end and a second shunt cable end;
    a spool, around which the shunt cable is wrapped;
    a first cable clamp, joined to the first shunt cable end;
    a second cable clamp, joined to the first shunt cable end;
    an ohm meter, joined to the shunt cable proximate the first cable clamp;
    wherein the ohm meter that shows a circuit connection between the first clamp and the second clamp when the first clamp and the second clamp are attached to the damaged railroad rail segment.

2. The assembly of claim 1, further comprising a railroad track having a plurality of ties joined to a first rail and a second rail.

3. The assembly of claim 2, wherein the first rail further comprises a first rail first segment, a first rail second segment, and a first rail third segment; wherein the first rail second segment is the damaged railroad rail segment.

4. The assembly of claim 3, wherein the spool further comprising a handle.

* * * * *